(12) United States Patent
Kim

(10) Patent No.: US 8,456,927 B2
(45) Date of Patent: Jun. 4, 2013

(54) PAGE BUFFER CIRCUIT

(75) Inventor: Byoung Young Kim, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 153 days.

(21) Appl. No.: 13/166,008

(22) Filed: Jun. 22, 2011

(65) Prior Publication Data

US 2012/0155190 A1 Jun. 21, 2012

(30) Foreign Application Priority Data

Dec. 21, 2010 (KR) .................. 10-2010-0132003

(51) Int. Cl.
*G11C 7/10* (2006.01)

(52) U.S. Cl.
USPC ............. 365/189.05; 365/189.12; 365/230.08

(58) Field of Classification Search
USPC ............. 365/185.12, 185.17, 185.18, 189.05, 365/230.08, 185.33
See application file for complete search history.

(56) References Cited

U.S. PATENT DOCUMENTS

| | | | |
|---|---|---|---|
| 5,612,632 A * | 3/1997 | Mahant-Shetti et al. | 326/46 |
| 7,477,530 B2 * | 1/2009 | Tashima et al. | 363/34 |
| 7,489,544 B2 * | 2/2009 | Kim et al. | 365/185.03 |
| 7,508,732 B2 * | 3/2009 | Park et al. | 365/235 |
| 8,014,208 B1 * | 9/2011 | Ferrante et al. | 365/185.22 |
| 2004/0141402 A1 * | 7/2004 | Kim | 365/230.08 |
| 2006/0181924 A1 * | 8/2006 | Cha | 365/185.12 |
| 2012/0275239 A1 * | 11/2012 | Song | 365/189.05 |

FOREIGN PATENT DOCUMENTS

KR 1020070050832 A 5/2007

* cited by examiner

*Primary Examiner* — Gene Auduong
(74) *Attorney, Agent, or Firm* — William Park & Associates Patent Ltd.

(57) ABSTRACT

A page buffer circuit includes: a main latch unit configured to have a main latch value which is dependent on a sub latch output signal, and output the main latch value to a first node; a sub latch unit configured to latch a voltage of a second node as a sub latch value in response to a storage enable signal, and generate the sub latch output signal according to the sub latch value when an output enable signal is activated; and a voltage determination unit connected between the first node and the second node, and configured to electrically connect or disconnect the first node to or from the second node in response to the storage enable signal, and determine a voltage level of the second node in response to the storage enable signal.

20 Claims, 2 Drawing Sheets

PAGE BUFFER CIRCUIT

CROSS-REFERENCES TO RELATED APPLICATION

The present application claims priority under 35 U.S.C. §119(a) to Korean Patent Application No. 10-2010-0132003, filed on Dec. 21, 2010, in the Korean Intellectual Property Office, which is incorporated herein by reference in its entirety as if set forth in full.

BACKGROUND

1. Technical Field

Various embodiments of the present invention relate to a semiconductor memory apparatus. In particular, certain embodiments relate to a semiconductor memory apparatus including a page buffer circuit.

2. Related Art

A typical semiconductor memory apparatus, such as a NAND flash memory, includes a memory cell array as a storage region for storing information and a page buffer circuit for storing data in the memory cell array or reading data from the memory cell array.

In addition, a semiconductor memory apparatus, such as a NAND flash memory, is classified into a Single Level Cell (SLC) scheme, a Multi Level Cell (MLC) scheme, and a Triple Level Cell (TLC) scheme, depending on the number of data bits that can be stored in a single memory cell.

A page buffer circuit often includes latch circuits for temporarily storing data, and the number of the required latch circuits varies depending on the SLC, MLC, and TLC schemes. For example, the MLC scheme requires one cache latch, one main latch, and two sub latches. The TLC scheme requires one cache latch, one main latch, and three sub latches.

The latch circuits included in the page buffer circuit may be configured with a typical latch and a dynamic latch. A typical latch has excellent data retention ability and driving ability but occupies a large area. Accordingly, in order to reduce the total size of the page buffer circuit, the latch circuit is often configured with a dynamic latch which is advantageous in terms of area.

FIG. 1 is a schematic diagram of a typical page buffer circuit using a dynamic latch as a sub latch.

The page buffer circuit may include a main latch unit 10 and a sub latch unit 20.

The main latch unit 10 usually exchanges data with a cache latch circuit (not shown) and a memory cell array (not shown). Since the cache latch circuit (not shown) and the memory cell array (not shown) are not essential for describing the background of the present invention, a description thereof will be omitted.

The main latch unit 10 may include a latch circuit having a main latch value. The main latch unit 10 is configured with a typical latch circuit in order to have large driving ability enough to exchange data with the memory cell array. The dynamic latch has an advantage over the typical latch circuit due to its narrow footage, but it is less suited to be used as the main latch unit 10 because driving ability of a dynamic latch is lower than that of a typical latch circuit. The main latch value of the main latch unit 10 may vary depending on data communicating with the cell array, data communicating with the cache latch circuit, and a sub latch output signal SLO.

The sub latch unit 20 stores the main latch value at a storage node ns as a sub latch value according to a storage enable signal F1SET. In addition, the sub latch unit 20 outputs a storage latch value as the sub latch output signal SLO according to an output enable signal F1TRAN.

The sub latch unit 20 latches temporary data received from the main latch unit 10, and recovers the temporary data to the main latch unit 10 through a sub latch signal DLS.

Therefore, when the sub latch unit 20 receives the temporary data from the main latch unit 10, the sub latch unit 20 should be able to retain the temporary data while the main latch unit 10 exchanges data with the cell array or the cache latch.

However, in FIG. 1, when a connection node nt is at a low level and the storage node ns is at a high level, the voltage level of the storage node ns, which is the storage latch value, is lowered due to a leakage current of a transistor 101. That is, an error may occur in the storage latch value by the leakage current.

Accordingly, a method of increasing static capacitance appearing at the storage node ns by coupling a capacitor transistor 104 to the storage node ns can be used, but such a capacitor transistor 104 may occupy a relatively large area.

In addition, a refresh operation is periodically performed in order to maintain the voltage level of the storage node ns. The refresh operation is an operation in which the storage latch value is transmitted to the main latch unit 10 as the sub latch output signal SLO while the main latch unit 10 does not communicate with the cache latch or the memory cell array, and the main latch unit 10 receives the sub latch output signal SLO as the main latch value and again transmits the received sub latch output signal SLO to the storage node ns of the sub latch unit 20 as the storage latch value.

However, since such a refresh operation uses the main latch unit 10, the operating speed of a flash memory apparatus is lowered.

As mentioned above, in the case of the MLC scheme, the page buffer circuit includes two sub latches and, in the case of the TLC scheme, the page buffer circuit includes three sub latches.

Since the operating speed of the page buffer circuit is usually lowered by the refresh operation, dynamic latches are not used as the two sub latches. That is, the dynamic latch is used as one or none of the sub latches, and the typical latch circuit is used as the other sub latch. The typical latch circuit is disadvantageous to the integration of the semiconductor apparatus because it occupies a larger area as compared to the dynamic latch circuit.

SUMMARY

Accordingly, there is a need for an improved page buffer circuit in a semiconductor memory apparatus which has a reduced size without substantially sacrificing the performance of the memory apparatus.

To attain the advantages and in accordance with the purposes of the invention, as embodied and broadly described herein, one exemplary aspect of the present invention may provide a page buffer circuit that includes: a main latch unit configured to have a main latch value which is dependent on a sub latch output signal, and output the main latch value to a first node; a sub latch unit configured to latch a voltage of a second node as a sub latch value in response to a storage enable signal, and generate the sub latch output signal according to the sub latch value when an output enable signal is activated; and a voltage determination unit connected between the first node and the second node, and configured to electrically connect or disconnect the first node to or from the second node in response to the storage enable signal, and determine a voltage level of the second node in response to the storage enable signal.

In another exemplary aspect of the present invention, a page buffer circuit includes: a main latch unit configured to have a main latch value which is dependent on a sub latch output signal, and output the main latch value to a first node; a first sub latch unit configured to latch a voltage of a second voltage as a first sub latch value in response to a first storage enable signal, and generate the sub latch output signal according to the first sub latch value when a first output enable signal is activated; a second sub latch unit configured to latch the voltage of the second voltage as a second sub latch value in response to a second storage enable signal, and generate the sub latch output signal according to the second sub latch value when a second output enable signal is activated; and a voltage determination unit connected between the first node and the second node, and configured to electrically connect or disconnect the first node to or from the second node in response to the first storage enable signal and the second storage enable signal, and determine a voltage level of the second node in response to the first storage enable signal and the second storage enable signal.

In another exemplary aspect of the present invention, a page buffer circuit includes: a main latch unit having a main latch value; a voltage determination unit configured to transfer the main latch value or a high level to a second node in response to a storage enable signal; and a sub latch unit configured to latch a voltage of the second node as a sub latch value in response to the storage enable signal.

In another exemplary aspect of the present invention, a page buffer circuit includes: a main latch unit having a main latch value; a voltage determination unit configured to transfer the main latch value or a high level to a second node in response to a first storage enable signal and a second storage enable signal; a first sub latch unit configured to latch a voltage of the second node as a first sub latch value in response to the first storage enable signal; and a second sub latch unit configured to latch the voltage of the second node as a second sub latch value in response to the second storage enable signal.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
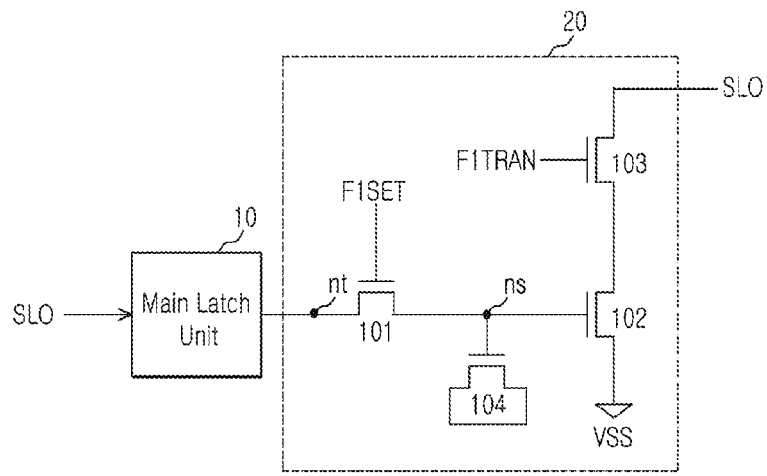
FIG. 1 is a schematic diagram of a typical page buffer circuit using a dynamic latch as a sub latch.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 2:
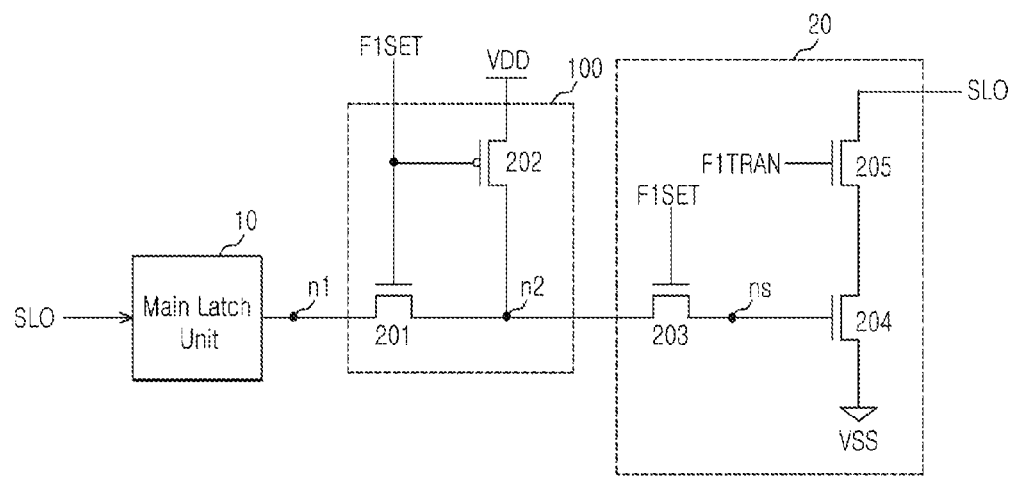
FIG. 2 is a circuit diagram of a page buffer circuit according to one exemplary embodiment.

FIG. 2 is a circuit diagram of a page buffer circuit according to one exemplary embodiment.

The page buffer circuit may include a main latch unit 10, a sub latch unit 20, and a voltage determination unit 100.

The main latch unit 10 may have a main latch value which is dependent on a sub latch output signal SLO, and outputs the main latch value to a first node n1.

The sub latch unit 20 latches a voltage of a second node n2 as a sub latch value in response to a storage enable signal F1SET, and generates the sub latch output signal SLO according to the sub latch value when an output enable signal F1TRAN is activated.

The voltage determination unit 100 may be connected between the first node n1 and the second node n2, and electrically connects or disconnects the first node n1 to or from the second node n2 in response to the storage enable signal F1SET. In addition, the voltage determination unit 100 determines the voltage level of the second node n2 in response to the storage enable signal F1SET.

The voltage determination unit 100 prevents the change in the voltage level of the storage node ns by equalizing the voltage level of the second node n2 to the voltage level of the storage node ns. The storage node ns is a node at which the sub latch value is stored (see FIG. 2). Therefore, the voltage level of the storage node ns, that is, the sub latch value, can be maintained for a longer time.

The main latch unit 10 may include the typical main latch unit 10 illustrated in FIG. 1. The main latch unit 10 has the main latch value which is dependent on the sub latch output signal SLO, and outputs the main latch value to the first node n1.

The sub latch unit 20 may include the typical sub latch unit 20 illustrated in FIG. 1. The sub latch unit 20 may include NMOS transistors 203, 204 and 205.

The NMOS transistor 203 may be connected between the second node n2 and the storage node ns and may receive the storage enable signal F1SET through the gate terminal thereof. The NMOS transistors 204 and 205 are connected in series. The voltage level of the storage node ns is applied to the gate terminal of the NMOS transistor 204. The source terminal of the NMOS transistor 204 is connected to the ground terminal VSS. The output enable signal F1TRAN is applied to the gate terminal of the NMOS transistor 205. The voltage at the drain terminal of the NMOS transistor 205 is outputted as the sub latch output signal SLO.

In the sub latch unit 20 illustrated in FIG. 2, when the storage enable signal F1SET is activated to a high level, the NMOS transistor 203 is turned on so that the voltage of the second node n2 is transferred to the storage node ns. Afterwards, when the storage enable signal F1SET is deactivated to a low level, the NMOS transistor 203 is turned off so that the voltage level of the storage node ns, that is, the sub latch value, is maintained.

In addition, in the sub latch unit 20 illustrated in FIG. 2, when the output enable signal F1TRAN is activated to a high level, the NMOS transistor 205 is turned on so that a current path is formed from the drain terminal to the source terminal of the NMOS transistor 205. At this time, when the voltage level of the storage node ns is a high level, the NMOS transistor 204 is turned on so that a current path is formed from the drain terminal of the NMOS transistor 205 to the ground terminal VSS. Therefore, the drain terminal of the NMOS transistor 205 is discharged, and the sub latch output signal SLO changes to a low level. On the contrary, if the voltage level of the storage node ns is a low level when the NMOS transistor 205 is in a turned-on state, the current path from the drain terminal to the source terminal of the NMOS transistor 205 is formed, but the current path from the drain terminal of the NMOS transistor 204 to the ground terminal VSS is blocked. Therefore, the sub latch output signal SLO is not changed. In such a state that the sub latch output signal SLO is at a high level, if the NMOS transistor 205 is turned on and the voltage level of the storage node ns is at a low level, the sub latch output signal SLO is maintained at the high level.

The voltage determination unit 100 may include an NMOS transistor 201 and a PMOS transistor 202. The NMOS transistor 201 is connected between the first node n1 and the second node n2 and receives the storage enable signal F1SET through a gate terminal thereof. The PMOS transistor 202 is connected between the power supply voltage terminal VDD and the second node n2 and receives the storage enable signal F1SET through a gate terminal thereof.

In the voltage determination unit 100 illustrated in FIG. 2, when the storage enable signal F1SET is activated to a high level, the NMOS transistor 201 is turned on so that the first node n1 and the second node n2 are electrically connected together. In addition, the PMOS transistor 202 is turned off. Therefore, the voltage level of the first node n1 is transferred to the second node n2. As described above, when the storage enable signal F1SET is activated to a high level, the NMOS transistor 203 also is turned on. Hence, the first node n1, the second node n2, and the storage node ns are electrically connected together. Hence, the voltage level of the first node n1 is transferred to the storage node ns. That is, the main latch value is stored as the sub latch value.

On the contrary, when the storage enable signal F1SET is deactivated to a low level, the NMOS transistor 201 is turned off so that the first node n1 and the second node n2 are electrically disconnected from each other. In addition, the PMOS transistor 202 is turned on so that the second node n2 is charged. Therefore, the voltage level of the second node n2 becomes a high level. Hence, the situation in which the storage node ns has a high level and the is second node (n2, the connection node nt of FIG. 1) has a low level, which is problematic in the related art, does not occur. If the storage node ns is at a high level, both of the second node n2 and the storage node ns are at a high level. Therefore, the NMOS transistor 203 does not generate a leakage current, and the sub latch value can be maintained for a longer time.

Furthermore, in the page buffer circuit illustrated in FIG. 2, when the storage node ns is at a low level, a situation in which the second node n2 has a high level and the storage node ns has a low level may occur. However, this situation does not greatly influence the sub latch value. The inventors of the present invention performed a simulation, considering transfer characteristics of the NMOS transistors 203 and 204 and impedance appearing at the storage node ns. As a result, the inventors of the present invention confirmed that, when the second node n2 was at a high level and the storage node ns was at a low level, the sub latch value was not influenced to a significant level (the sub latch value was not changed) during a write operation time of the semiconductor memory apparatus including the page buffer circuit.

Figure 3:
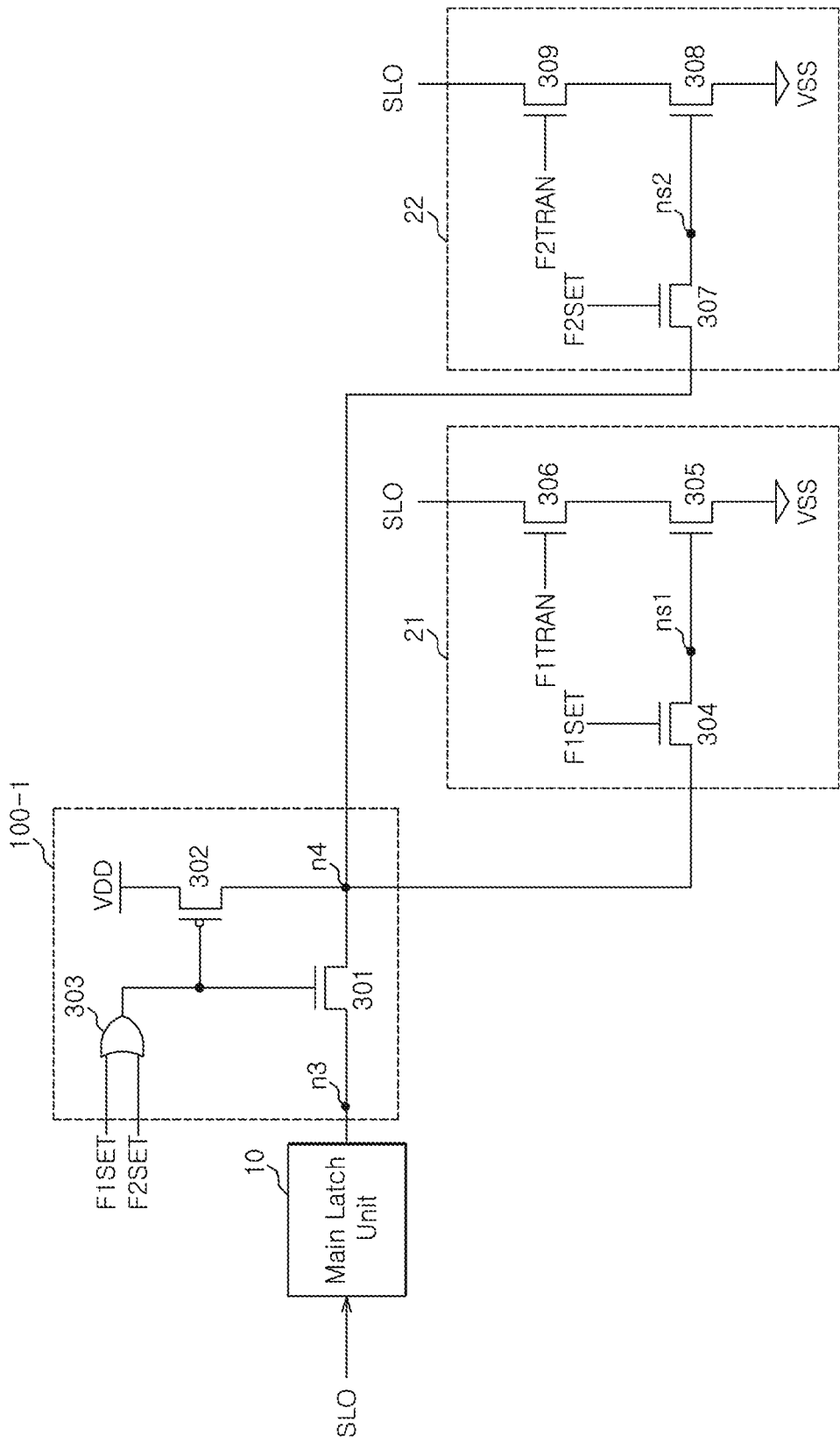
FIG. 3 is a circuit diagram of a page buffer circuit according to another exemplary embodiment.

FIG. 3 is a circuit diagram of a page buffer circuit according to another exemplary embodiment.

The page buffer circuit illustrated in FIG. 3 can be suitably used in a page buffer including a plurality of sub latches.

As described above, the MLC scheme or the TLC scheme includes a plurality of latches. The page buffer circuit illustrated in FIG. 3 is configured to include one main latch unit 10 and two sub latch units 21 and 22; however, the present invention is not limited thereto.

The page buffer circuit illustrated in FIG. 3 may include a main latch unit 10, a first sub latch unit 21, a second sub latch unit 22, and a voltage determination unit 100-1.

The main latch unit 10 has a main latch value which is dependent on a sub latch output signal SLO, and outputs the main latch value to a first node n3.

The first sub latch unit 21 latches a voltage of a second node n4 as a first sub latch value in response to a first storage enable signal F1SET, and generates the sub latch output signal SLO according to the first sub latch value when a first output enable signal F1TRAN is activated.

The second sub latch unit 22 latches the voltage of the second node n4 as a second sub latch value in response to a second storage enable signal F2SET, and generates the sub latch output signal SLO according to the second sub latch value when a second output enable signal F2TRAN is activated.

The voltage determination unit 100-1 electrically connects or disconnects the first node n3 to or from the second node n4 in response to the first and second storage enable signals F1SET and F2SET, and determines the voltage level of the second node n4 in response to the first and second storage enable signals F1SET and F2SET.

The main latch unit 10 may include the main latch units 10 illustrated in FIGS. 1 and 2. The main latch unit 10 has the main latch value which is dependent on the sub latch output signal SLO, and outputs the main latch value to the first node n3.

The first and second sub latch units 21 and 22 may include the sub latch units 20 illustrated in FIGS. 1 and 2.

The first and second sub latch units 21 and 22 include a first storage ns1 and a second storage node ns2 in order to store the first sub latch value and the second sub latch value, respectively.

In the typical semiconductor memory apparatus, since the first and second sub latch units 21 and 22 are latch units for storing different temporary data, the first and second storage enable signals F1SET and F2SET are not activated at the same time.

In addition, the first and second output enable signals F1TRAN and F2TRAN also are not activated at the same time. Therefore, although the sub latch output signals SLO generated from the first and second sub latch units 21 and 22 are the same signal, they are activated at different points of time.

Since the first and second sub latch units 21 and 22 are configured and operated identically to the sub latch unit 20 illustrated in FIG. 2, except for the signal input/output relation, a detailed description thereof will be omitted.

The voltage determination unit 100-1 may include an NMOS transistor 301, a PMOS transistor 302, and an OR gate 303.

The OR gate 303 performs an OR operation on the first storage enable signal F1SET and the second storage enable signal F2SET. The NMOS transistor 301 is connected between the first node n3 and the second node n4 and receives the output signal of the OR gate 303 through a gate terminal thereof. The PMOS transistor 302 is connected between the power supply voltage terminal VDD and the second node n4 and receives the output signal of the OR gate 303 through a gate terminal thereof.

Since the NMOS transistor 301 receives the output signal of the OR gate 303 through the gate terminal thereof, the NMOS transistor 301 electrically couples the first node n3 to the second node n4 when the first storage enable signal F1SET or the second storage enable signal F2SET is activated to a high level.

In addition, the NMOS transistor 301 electrically disconnects the first node n3 from the second node n4 when both of the first storage enable signal F1SET and the second storage enable signal F2SET are deactivated to a low level.

Since the PMOS transistor 302 receives the output signal of the OR gate 303 through the gate terminal thereof, the PMOS transistor 302 is turned off when the first storage enable signal F1SET or the second storage enable signal F2SET is activated to a high level.

Furthermore, when both of the first storage enable signal F1SET and the second storage enable signal F2SET are deactivated to a low level, the PMOS transistor 302 is turned on so that the second node n4 is charged. Therefore, the voltage of the second node n4 is fixed to a high level.

The page buffer circuit illustrated in FIG. 3 is operated in a similar manner to the page buffer circuit illustrated in FIG. 2. Since the page buffer circuit illustrated in FIG. 3 fixes the second node n4 to a high level when both of the first storage enable signal F1SET and the second storage enable signal F2SET are deactivated, the case in which the first storage node ns1 or the second storage node ns2 has a high level and the second node (n2, the connection node nt of FIG. 1) has a low level, which is problematic in the related art, is prevented.

Therefore, no leakage current is generated in the NMOS transistors 304 and 307 of FIG. 3, and the first and second sub latch values can be maintained for a longer time.

The page buffer circuits according to the exemplary embodiments achieve an effect that makes the dynamic latch maintain the sub latch value for a longer time by reducing the leakage current of the transistors.

In addition, since the sub latch value is maintained for a longer time, the page buffer circuits according to the embodiments achieve an effect that can skip a refresh operation on the dynamic latch. While the typical page buffer circuit should perform a refresh operation using the main latch unit 10 in order to retain the sub latch value, the page buffer circuits according to the embodiments can skip the refresh operation.

In addition, since the refresh operation on the dynamic latch is skipped, the page buffer circuits according to the embodiments is achieve an effect that improves the operating speed of the semiconductor memory apparatus. Since the refresh operation for retaining the sub latch value can be skipped, the page buffer circuits according to the embodiments can reduce the operating time necessary for the refresh operation. Therefore, the operating speed of the semiconductor memory apparatus including the page buffer circuits according to the embodiments can be improved.

Furthermore, since the capacitor transistors are unnecessary, the page buffer circuits according to the embodiments achieve an effect that can reduce an area necessary for the semiconductor memory apparatus. Since the voltage levels of the storage nodes ns, ns1 and ns2 are maintained for a longer time, the page buffer circuits according to the embodiments require no capacitor transistors for maintaining the voltage of the storage node ns in the typical page buffer circuit. As described above, since the capacitor transistor occupies a large area as compared to other elements, the page buffer circuits according to the embodiments achieve an effect that can reduce an area necessary for the dynamic latch.

Moreover, since the refresh operation on the dynamic latch is skipped, the page buffer circuits according to the embodiments can use dynamic latches as more sub latches. Therefore, an area necessary for the semiconductor memory apparatus can be reduced.

As described above, when the sub latch unit 20 is configured with the dynamic latch, the typical page buffer circuit additionally is performs the refresh operation and thus its operating speed may be limited. Thus, there is a limit to using the dynamic latch as the sub latch unit 20. In general, the semiconductor memory apparatus including a plurality of sub latch units 20 as in case of the MLC scheme and the TLC scheme may use the dynamic latch as one or less sub latch unit 20. However, since the page buffer circuits according to the embodiments require no refresh operation, more sub latch units 20 can be configured with the dynamic latches. As described above, since the dynamic latch circuit occupies a smaller area than the typical latch circuit, the page buffer circuits according to the embodiments achieve an effect that reduces an area necessary for the semiconductor memory apparatus.

While certain embodiments have been described above, it will be understood to those skilled in the art that the embodiments described are by way of example only. Accordingly, the page buffer circuit described herein should not be limited based on the described embodiments. Rather, the page buffer circuit described herein should only be limited in light of the claims that follow when taken in conjunction with the above description and accompanying drawings.

What is claimed is:

1. A page buffer circuit comprising:
   a main latch unit configured to have a main latch value which is dependent on a sub latch output signal, and output the main latch value to a first node;
   a sub latch unit configured to latch a voltage of a second node as a sub latch value in response to a storage enable signal, and generate the sub latch output signal according to the sub latch value when an output enable signal is activated; and
   a voltage determination unit connected between the first node and the second node, and configured to electrically connect or disconnect the first node to or from the second node in response to the storage enable signal, and determine a voltage level of the is second node in response to the storage enable signal.

2. The page buffer circuit according to claim 1, wherein the voltage determination unit comprises:
   a switch unit configured to electrically connect or disconnect the first node to or from the second node according to the storage enable signal; and
   a driving unit configured to charge the second node to a predetermined level according to the storage enable signal.

3. The page buffer circuit according to claim 2,
   wherein, when the storage enable signal is activated, the voltage determination unit electrically connects the first node to the second node, and
   wherein, when the storage enable signal is deactivated, the voltage determination unit electrically disconnects the first node from the second node and fixes the voltage of the second node to the predetermined level.

4. The page buffer circuit according to claim 3, wherein the predetermined level is a logic high level.

5. The page buffer circuit according to claim 1, wherein the sub latch unit comprises:
   a switch unit configured to electrically connect the second node to a storage node in response to the storage enable signal; and
   an output unit configured to generate the sub latch output signal according to the output enable signal and a voltage level of the storage node.

6. A page buffer circuit comprising:
   a main latch unit configured to have a main latch value which is dependent on a sub latch output signal, and output the main latch value to a first node;

a first sub latch unit configured to latch a voltage of a second voltage as a first sub latch value in response to a first storage enable signal, and generate the sub latch output signal according to the first sub latch value when a first output enable signal is activated;

a second sub latch unit configured to latch the voltage of the second voltage as a second sub latch value in response to a second storage enable signal, and generate the sub latch output signal according to the second sub latch value when a second output enable signal is activated; and a voltage determination unit connected between the first node and the second node, and configured to electrically connect or disconnect the first node to or from the second node in response to the first storage enable signal and the second storage enable signal, and determine a voltage level of the second node in response to the first storage enable signal and the second storage enable signal.

7. The page buffer circuit according to claim 6, wherein the voltage determination unit comprises:

a switch unit configured to electrically connect or disconnect the first node to or from the second node according to the first storage enable signal and the second storage enable signal; and a driving unit configured to charge the second node to a high level according to the first storage enable signal and the second storage enable signal.

8. The page buffer circuit according to claim 7, wherein, when the first storage enable signal or the second storage enable signal is activated, the voltage determination unit electrically connects the first node to the second node, and wherein, when both of the first storage enable signal and the second storage enable signal are deactivated, the voltage determination unit electrically disconnects the first node from the second node and fixes the voltage of the second node to a predetermined level.

9. The page buffer circuit according to claim 8, wherein the predetermined level is a logic high level.

10. The page buffer circuit according to claim 6, wherein the first sub latch unit comprises:

a switch unit configured to electrically connect the second node to a first storage node in response to the first storage enable signal; and an output unit configured to generate the sub latch output signal according to the first output enable signal and a voltage level of the first storage node.

11. The page buffer circuit according to claim 6, wherein the second sub latch unit comprises:

a switch unit configured to electrically connect the second node to a second storage node in response to the second storage enable signal; and an output unit configured to generate the sub latch output signal according to the second output enable signal and a voltage level of the second storage node.

12. A page buffer circuit comprising:

a main latch unit having a main latch value;

a voltage determination unit configured to transfer the main latch value or a high level to a second node in response to a storage enable signal; and a sub latch unit configured to latch a voltage of the second node as a sub latch value in response to the storage enable signal.

13. The page buffer circuit according to claim 12, wherein the voltage determination unit comprises:

is a switch unit configured to transfer the main latch value to the second node when the storage enable signal is activated; and a driving unit configured to charge the second node to a high level when the storage enable signal is deactivated.

14. The page buffer circuit according to claim 12, wherein the sub latch unit further performs an operation of generating a sub latch output signal according to the sub latch value when an output enable signal is activated, and wherein the main latch unit has the main latch value which is dependent on the sub latch output signal.

15. The page buffer circuit according to claim 14, wherein the sub latch unit comprises:

a switch unit configured to electrically connect the second node to a storage node in response to the storage enable signal; and an output unit configured to generate the sub latch output signal according to the output enable signal and a voltage level of the storage node.

16. A page buffer circuit comprising:

a main latch unit having a main latch value;

a voltage determination unit configured to transfer the main latch value or a high level to a second node in response to a first storage enable signal and a second storage enable signal;

is a first sub latch unit configured to latch a voltage of the second node as a first sub latch value in response to the first storage enable signal; and a second sub latch unit configured to latch the voltage of the second node as a second sub latch value in response to the second storage enable signal.

17. The page buffer circuit according to claim 16, wherein the voltage determination unit comprises:

a switch unit configured to transfer the main latch value to the second node when the first storage enable signal or the second storage enable signal is activated; and a driving unit configured to charge the second node to a high level when the first storage enable signal and/or the second storage enable signal are/is deactivated.

18. The page buffer circuit according to claim 16, wherein the first sub latch unit further performs an operation of generating a first sub latch output signal according to the first sub latch value when a first output enable signal is activated, wherein the second sub latch unit further performs an operation of generating a second sub latch output signal according to the second sub latch value when a second output enable signal is activated, and wherein the main latch unit has the main latch value which is dependent on the first sub latch output signal and the second sub latch output signal.

19. The page buffer circuit according to claim 18, wherein the first sub latch unit comprises:

a switch unit configured to electrically connect the second node to a storage node in response to the first storage enable signal; and an output unit configured to generate the first sub latch output signal according to the first output enable signal and a voltage level of the storage node.

20. The page buffer circuit according to claim 18, wherein the second sub latch unit comprises:

a switch unit configured to electrically connect the second node to a storage node in response to the second storage enable signal; and an output unit configured to generate the second sub latch output signal according to the second output enable signal and a voltage level of the storage node.

* * * * *